(12) United States Patent
Ye et al.

(10) Patent No.: US 9,460,918 B2
(45) Date of Patent: *Oct. 4, 2016

(54) EPITAXY OF HIGH TENSILE SILICON ALLOY FOR TENSILE STRAIN APPLICATIONS

(71) Applicant: Applied Materials, Inc., Santa Clara, CA (US)

(72) Inventors: Zhiyuan Ye, San Jose, CA (US); Xuebin Li, Santa Clara, CA (US); Saurabh Chopra, Santa Clara, CA (US); Yihwan Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/133,148

(22) Filed: Dec. 18, 2013

(65) Prior Publication Data

US 2014/0106547 A1 Apr. 17, 2014

Related U.S. Application Data

(63) Continuation of application No. 13/193,576, filed on Jul. 28, 2011, now Pat. No. 8,652,945.

(60) Provisional application No. 61/440,627, filed on Feb. 8, 2011.

(51) Int. Cl.
*H01L 21/20* (2006.01)
*H01L 21/02* (2006.01)
(Continued)

(52) U.S. Cl.
CPC ..... *H01L 21/02532* (2013.01); *H01L 21/0257* (2013.01); *H01L 21/0262* (2013.01); *H01L 21/02576* (2013.01); *H01L 29/1054* (2013.01); *H01L 29/78* (2013.01)

(58) Field of Classification Search
CPC .............. H01L 21/02532; H01L 21/02576; H01L 21/0257; H01L 29/1054; H01L 21/0262; H01L 29/78

USPC .......................................................... 438/478
See application file for complete search history.

(56) References Cited

U.S. PATENT DOCUMENTS 5,316,958 A 5/1994 Meyerson
5,700,520 A 12/1997 Beinglass et al.
(Continued)

FOREIGN PATENT DOCUMENTS

CN 1875461 A 12/2006
JP H10-41321 A 2/1998

OTHER PUBLICATIONS

Search Report and Written Opinion dated Mar. 16, 2012 for International Application No. (PCT/US2011/045795.
(Continued)

*Primary Examiner* — Latanya N Crawford
(74) *Attorney, Agent, or Firm* — Patterson & Sheridan, LLP

(57) ABSTRACT

Embodiments of the present invention generally relate to methods for forming silicon epitaxial layers on semiconductor devices. The methods include forming a silicon epitaxial layer on a substrate at increased pressure and reduced temperature. The silicon epitaxial layer has a phosphorus concentration of about $1 \times 10^{21}$ atoms per cubic centimeter or greater, and is formed without the addition of carbon. A phosphorus concentration of about $1 \times 10^{21}$ atoms per cubic centimeter or greater increases the tensile strain of the deposited layer, and thus, improves channel mobility. Since the epitaxial layer is substantially free of carbon, the epitaxial layer does not suffer from film formation and quality issues commonly associated with carbon-containing epitaxial layers.

6 Claims, 3 Drawing Sheets

(51) Int. Cl.
*H01L 29/10* (2006.01)
*H01L 29/78* (2006.01)

(56) References Cited

U.S. PATENT DOCUMENTS

| | | | |
|---|---|---|---|
| 5,731,626 | A | 3/1998 | Eaglesham et al. |
| 6,107,197 | A | 8/2000 | Suzuki |
| 6,197,666 | B1 | 3/2001 | Schafer et al. |
| 6,346,452 | B1 | 2/2002 | Kabir et al. |
| 6,579,752 | B2 | 6/2003 | De Boer |
| 7,166,528 | B2 | 1/2007 | Kim et al. |
| 7,176,111 | B2 | 2/2007 | Baert et al. |
| 7,195,985 | B2 | 3/2007 | Murthy et al. |
| 2003/0045063 | A1 | 3/2003 | Oda |
| 2005/0079691 | A1 | 4/2005 | Kim et al. |
| 2008/0079691 | A1 | 4/2008 | Kuboyama et al. |
| 2008/0102602 | A1 | 5/2008 | Park et al. |
| 2008/0169512 | A1 | 7/2008 | Doyle et al. |
| 2008/0182075 | A1 | 7/2008 | Chopra et al. |
| 2009/0026496 | A1 | 1/2009 | Bauer et al. |
| 2010/0224937 | A1 | 9/2010 | Sridhar |
| 2011/0147828 | A1* | 6/2011 | Murthy et al. ............... 257/327 |
| 2014/0084369 | A1* | 3/2014 | Murthy et al. ............... 257/344 |

OTHER PUBLICATIONS

Chinese Office Action dated Jun. 30, 2015 for Application No. 201180066837.0.
Taiwan Office Action dated Jul. 28, 2015 for Application No. 103137871.
Chinese Office Action dated Mar. 15, 2016 for Application No. 201180066837.0.
Huang et al., "Further study on structural and electronic properties of silicon phosphide compounds with 3:4 stoichiometry", Computational Materials Science, Elsevier, Amsterdam, NL, Aug. 2004 vol. 30, No. 3-4, pp. 371-375.
Maiti C. K. et al., "Chapter 2: Strained Layer Epitaxy", Strained Heterostructures : Materials and Devices, 2001, pp. 24-97.
European Search Report dated Oct. 9, 2016 for Application No. 118581628.
Chinese Office Action dated Nov. 19, 2015 for Application No. 201180066837.0.

* cited by examiner

EPITAXY OF HIGH TENSILE SILICON ALLOY FOR TENSILE STRAIN APPLICATIONS

CROSS-REFERENCE TO RELATED APPLICATIONS

This application is a continuation of co-pending U.S. patent application Ser. No. 13/193,576, filed Jul. 28, 2011, which claims benefit of U.S. Provisional Patent Application Ser. No. 61/440,627, filed Feb. 8, 2011. Each of the aforementioned patent applications is herein incorporated by reference.

BACKGROUND OF THE INVENTION

1. Field of the Invention

Embodiments of the invention generally relate to the field of semiconductor manufacturing processes and devices, more particularly, to methods of depositing silicon-containing films for forming semiconductor devices.

2. Description of the Related Art

Size reduction of metal-oxide-semiconductor field-effect transistors (MOSFET) has enabled the continued improvement in speed performance, density, and cost per unit function of integrated circuits. One way to improve transistor performance is through application of stress to the transistor channel region. Stress distorts (e.g., strains) the semiconductor crystal lattice, and the distortion, in turn, affects the band alignment and charge transport properties of the semiconductor. By controlling the magnitude of stress in a finished device, manufacturers can increase carrier mobility and improve device performance. There are several existing approaches of introducing stress into the transistor channel region.

One such approach of introducing stress into the transistor channel region is to incorporate carbon into the region during the formation of the region. The carbon present in the region affects the semiconductor crystal lattice and thereby induces stress. However, the quality of epitaxially-deposited films decreases as carbon concentration within the film increases. Thus, there is a limit to the amount of tensile stress which can be induced before film quality becomes unacceptable.

Generally, carbon concentrations above about 1 atomic percent seriously reduce film quality and increase the probability of film growth issues. For example, film growth issues such as undesired polycrystalline or amorphous silicon growth, instead of epitaxial growth, may occur due to the presence of carbon concentrations greater than 1 atomic percent. Therefore, the benefits that can be gained by increasing the tensile stress of a film through carbon incorporation are limited to films having carbon concentrations of 1 atomic percent or less. Moreover, even films which contain less than 1 atomic percent carbon still experience some film quality issues.

Therefore, there is a need for producing a high tensile stress epitaxial film which is substantially free of carbon.

SUMMARY OF THE INVENTION

Embodiments of the present invention generally relate to methods for forming silicon epitaxial layers on semiconductor devices. The methods include forming a silicon epitaxial layer on a substrate at increased pressure and reduced temperature. The silicon epitaxial layer has a phosphorus concentration of about $1 \times 10^{21}$ atoms per cubic centimeter or greater, and is formed without the addition of carbon. A phosphorus concentration of about $1 \times 10^{21}$ atoms per cubic centimeter or greater increases the tensile strain of the deposited layer, and thus, improves channel mobility. Since the epitaxial layer is substantially free of carbon, the epitaxial layer does not suffer from film formation and quality issues commonly associated with carbon-containing epitaxial layers.

In one embodiment, a method of forming a film on a substrate comprises positioning a substrate within a processing chamber, and heating the substrate to a temperature within a range from about 550 degrees Celsius to about 700 degrees Celsius. One or more process gases are then introduced into the processing chamber. The one or more process gases comprise a silicon source and a phosphorus source. A substantially carbon-free silicon epitaxial layer is then deposited on the substrate. The substantially carbon-free silicon epitaxial layer has a phosphorus concentration of about $1 \times 10^{21}$ atoms per cubic centimeter or greater. The substantially carbon-free silicon epitaxial layer is deposited at a chamber pressure of about 300 Torr or greater.

In another embodiment, a method of forming a film on a substrate comprises positioning a substrate within a processing chamber and heating the substrate to a temperature within a range from about 600 degrees Celsius to about 650 degrees Celsius. One or more process gases are then introduced into the processing chamber. The one or more process gases comprise a silicon source and a phosphorus source. A substantially carbon-free silicon epitaxial layer is then deposited on the substrate. The substantially carbon-free silicon epitaxial layer has a phosphorus concentration of about $1 \times 10^{21}$ atoms per cubic centimeter or greater and is deposited at a chamber pressure of about 300 Torr or greater.

In another embodiment, a method of forming a film on a substrate comprises positioning a substrate within a processing chamber and heating the substrate to a temperature within a range from about 550 degrees Celsius to about 750 degrees Celsius. Phosphine and at least one silane or disilane are then introduced into the processing chamber and a substantially carbon-free silicon epitaxial layer is deposited on the substrate. The substantially carbon-free silicon epitaxial layer has a phosphorus concentration of about $1 \times 10^{21}$ atoms per cubic centimeter or greater and is deposited at a chamber pressure of about 150 Torr or greater.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for forming silicon epitaxial layers on semiconductor devices. The methods include forming a silicon epitaxial layer on a substrate at increased pressure and reduced temperature. The silicon epitaxial layer has a phosphorus concentration of about $1 \times 10^{21}$ atoms per cubic centimeter or greater, and is formed without the addition of carbon. A phosphorus concentration of about $1 \times 10^{21}$ atoms per cubic centimeter or greater increases the tensile strain of the deposited layer, and thus, improves channel mobility. Since the epitaxial layer is substantially free of carbon, the epitaxial layer does not suffer from film formation and quality issues commonly associated with carbon-containing epitaxial layers. Substantially free of carbon as used herein refers to a film which is formed without the use of a carbon-containing precursor; however, it is contemplated that trace amounts of carbon may be present in the film due to contamination.

Embodiments of the present invention may be practiced in the CENTURA® RP Epi chamber available from Applied Materials, Inc., of Santa Clara, Calif. It is contemplated that other chambers, including those available from other manufacturers, may be used to practice embodiments of the invention.

Figure 1:
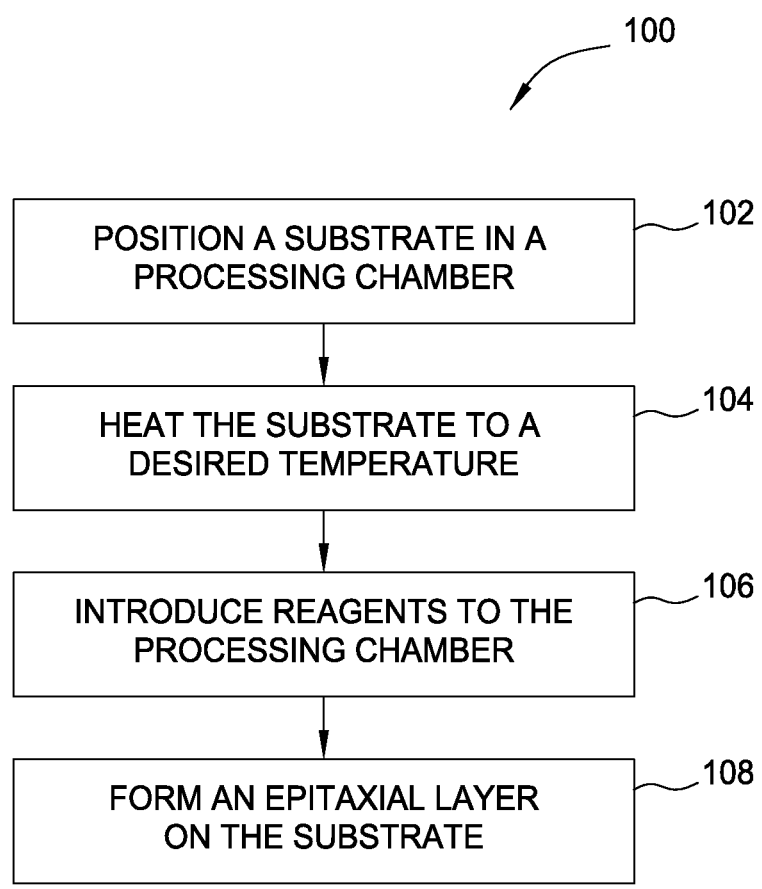
FIG. 1 is a flow chart illustrating a method of forming a phosphorus-containing silicon epitaxial layer.

FIG. 1 is a flow chart 100 illustrating a method of forming a phosphorus-containing silicon epitaxial layer. In step 102, a monocrystalline silicon substrate is positioned within a processing chamber. In step 104, the substrate is heated to a predetermined temperature. The substrate is generally heated to a temperature within a range from about 550 degrees Celsius to about 700 degrees Celsius. It is desirable to minimize the thermal budget of the final device by heating the substrate to the lowest temperature sufficient to thermally decompose process reagents and deposit an epitaxial film on the substrate. However, as increased temperatures generally lead to increased throughput, it is contemplated that higher temperatures may be used as dictated by production requirements.

In step 106, process gases containing one or more processing reagents are introduced into the processing chamber. The process gases include a silicon source and phosphorus source for depositing a phosphorus-containing silicon epitaxial layer on the substrate. Optionally, the one or more process gases may include a carrier gas for delivering the silicon source and the phosphorus source to the processing chamber, as well as an etchant when performing selective deposition processes.

An exemplary phosphorus source includes phosphine, which may be delivered to the processing chamber at a rate of about 2 sccm to about 30 sccm or greater. For example, the flow rate of phosphine may be about 12 sccm to about 15 sccm. Suitable carrier gases include nitrogen, hydrogen, or other gases which are inert with respect to the deposition process. The carrier gas may be provided to the processing chamber at a flow rate within a range from about 3 SLM to about 30 SLM. Suitable silicon sources include dichlorosilane, silane, and disilane. The silicon source may be delivered to the processing chamber at a flow rate between about 300 sccm and 400 sccm. While other silicon and phosphorus sources are contemplated, it is generally desirable that carbon addition to the processing atmosphere is minimized, thus, carbon-containing precursors should be avoided.

In step 108, the mixture of reagents is thermally driven to react and deposit a phosphorus-containing silicon epitaxial layer on the substrate surface. During the deposition process, the pressure within the processing chamber is maintained at about 150 Torr or greater, for example, about 300 Torr to about 600 Torr. It is contemplated that pressures greater than about 600 Torr may be utilized when low pressure deposition chambers are not employed. In contrast, typical epitaxial growth processes in low pressure deposition chambers maintain a processing pressure of about 10 Torr to about 100 Torr and a processing temperature greater than 700 degrees Celsius. However, by increasing the pressure to about 150 Torr or greater, the deposited epitaxial film is formed having a greater phosphorus concentration (e.g., about $1 \times 10^{21}$ atoms per cubic centimeter to about $5 \times 10^{21}$ atoms per cubic centimeter) compared to lower pressure epitaxial growth processes. Furthermore, high flow rates of phosphorus source gas provided during low pressure depositions often result in "surface poisoning" of the substrate, which suppresses epitaxial formation. Surface poisoning is typically not experienced when processing at pressures above 300 Torr, due to the silicon source flux overcoming the poisoning effect. Thus, increased processing pressures are desirable for epitaxial processes utilizing high dopant flow rates.

The phosphorus concentration of an epitaxial film formed at a pressure less than 100 Torr is approximately $3 \times 10^{20}$ atoms per cubic centimeter when providing a phosphine flow rate of about 3 sccm to about 5 sccm. Thus, epitaxial layers formed at higher pressures (e.g., 300 Torr or greater) experience approximately a tenfold increase in phosphorus concentration compared to epitaxial films formed at pressures below about 100 Torr or less. It is believed that at a phosphorus concentration of about $1 \times 10^{21}$ atoms per cubic centimeter or greater, the deposited epitaxial film is not purely a silicon film doped with phosphorus, but rather, that the film is an alloy between silicon and silicon phosphide (e.g., pseudocubic $Si_3P_4$). It is believed that the silicon/silicon phosphide alloy attributes to the increased tensile stress of the epitaxial film. The likelihood of forming the silicon/silicon phosphide alloy increases with greater phosphorus concentrations, since the probability of adjacent phosphorus atoms interacting is increased.

Epitaxial films which are formed at process temperatures between about 550 degrees Celsius and about 750 degrees Celsius and at pressures above 300 Torr experience increased tensile stress when doped to a sufficient phosphorus concentration (e.g., about $1 \times 10^{21}$ atoms per cubic centimeter or greater). Carbon-free epitaxial films formed under such conditions experience approximately 1 gigapascal to about 1.5 gigapascals of tensile stress, which is equivalent to a low pressure silicon epitaxial film containing about 1.5 percent carbon. However, as noted above, epitaxial films containing greater than about 1 percent carbon suffer from decreased film quality, and are thus undesirable. Furthermore, carbon-doped silicon epitaxy processes typically utilize cyclical deposition-etch processes which increase process complexity and cost. Producing an epitaxial film according to embodiments herein not only results in a film having a tensile stress equal to or greater than a 1.5 percent carbon-containing epitaxial film, but the resistivity of the carbon-free film is also lower (e.g., about 0.6 milliohm-centimeters compared to about 0.9 milliohm-centimeters). Thus, the substantially carbon-free epitaxial film exhibits higher film quality, lower resistivity, and equivalent tensile stress when compared to carbon-containing epitaxial films.

The tensile strain of the epitaxially-grown film can further be increased by reducing the deposition temperature during the epitaxial growth process. In a first example, a phosphorus-doped silicon epitaxial film is deposited at a chamber pressure of 700 Torr and a temperature of about 750 degrees Celsius. Process gases containing 300 sccm of dichlorosilane and 5 sccm of phosphine were provided to a process chamber during the growth process. The deposited film contained a phosphorus concentration of about $3 \times 10^{20}$ atoms per cubic centimeter, and exhibited a tensile strain equal to a silicon epitaxial film having a carbon concentration of about 0.5 atomic percent. In a second example, a phosphorus-doped silicon epitaxial film was deposited on another substrate under similar process conditions; however, the process temperature was reduced to about 650 degrees Celsius, and the flow rate of phosphine was increased to 20 sccm. The phosphorus-doped silicon epitaxial film had a tensile strain equivalent to a film containing 1.8 atomic percent carbon. Thus, as process temperature is reduced and dopant concentration is increased, the tensile strain within the deposited epitaxial film increases. It is to be noted, however, that the tensile strain benefits due to decreased temperature may be limited, since there is minimum temperature which is required to react and deposit the process reagents.

In a third example, a phosphorus-doped silicon epitaxial film was formed under similar process conditions as the first example; however, the flow rate of phosphine during processing was reduced to about 2 sccm. The resultant phosphorus-doped silicon epitaxial film had a tensile strain equivalent to a film having about 0.2 percent carbon. Additionally, the resultant film had a resistivity of about 0.45 milliohm-centimeters compared to 0.60 milliohm-centimeters for the film of the first example. Thus, not only can the tensile strain of an epitaxial film be adjusted by varying temperature and or pressure during the deposition process, but the resistivity can also be adjusted by varying the amount of dopant provided to the processing chamber.

Figure 2:
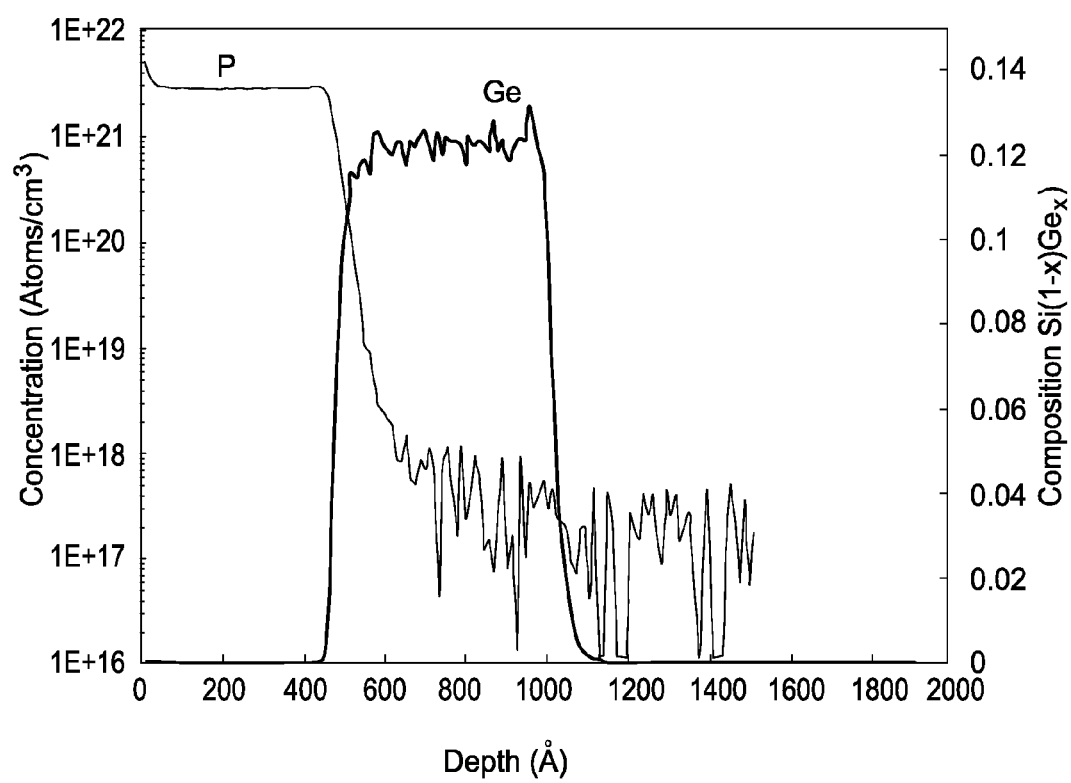
FIG. 2 is a graph illustrating the dopant profile of a film formed according to embodiments of the invention.

FIG. 2 is a graph illustrating the dopant profile of a film formed according to embodiments of the invention. The analyzed film of FIG. 2 was formed by heating a silicon substrate having a silicon-germanium layer thereon to a temperature of about 650 degrees Celsius. Approximately 300 sccm of dichlorosilane and 30 sccm of phosphine were delivered to a processing chamber maintained at a pressure of about 600 Torr. A 450 angstrom silicon epitaxial film was formed on the silicon-germanium layer. As determined by secondary ion mass spectroscopy, the phosphorus-doped epitaxial film had a uniform phosphorus concentration of about $3 \times 10^{21}$ atoms per cubic centimeter, and was substantially free of carbon. In contrast to the film analyzed in FIG. 2, epitaxial films formed at lower pressures, such as less than 300 Torr, have a phosphorus concentration of about $3 \times 10^{20}$ atoms per cubic centimeter. Thus, the epitaxial film formed according to embodiments described herein exhibited a tenfold increase in phosphorus concentration as compared to epitaxial films formed at lower pressures.

Figure 3:
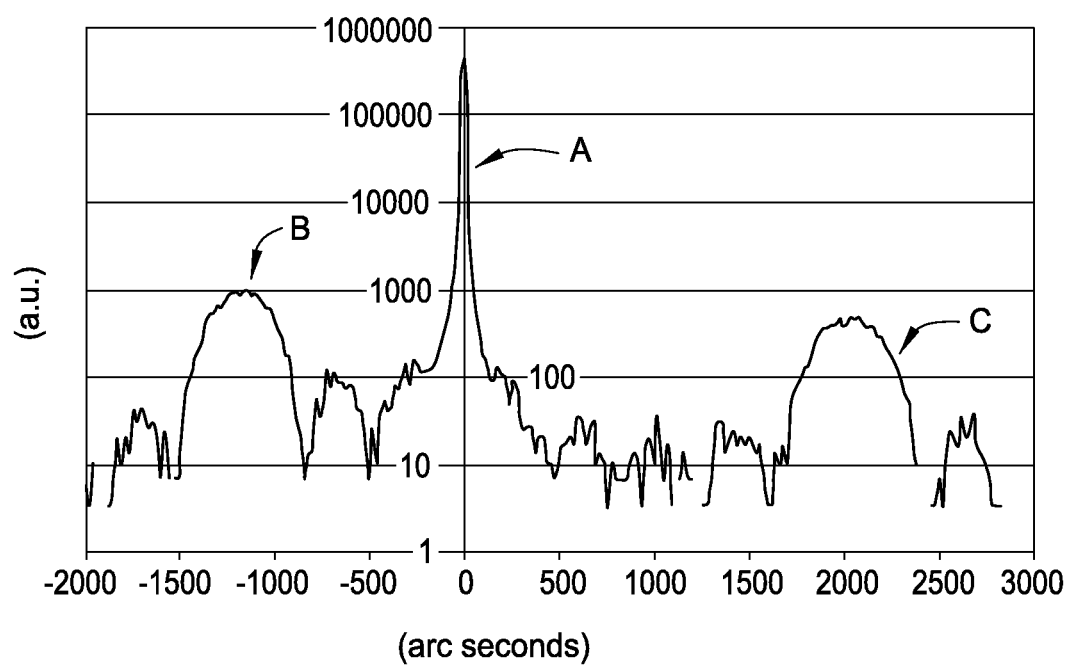
FIG. 3 is a graph illustrating the tensile stress of the film of FIG. 2.

FIG. 3 is a graph illustrating the tensile stress of the film of FIG. 2 as determined by high resolution X-ray diffraction. The peak A corresponds to the tensile stress of the monocrystalline silicon substrate, while the peak B corresponds to the tensile stress of the silicon-germanium layer. The peak C corresponds to the tensile stress of the phosphorus-containing epitaxial layer. The well defined edges of the peak B and the peak C are indicative of high quality epitaxial films having uniform composition. The peak B corresponds to a silicon-germanium epitaxial layer containing about 12.3 percent germanium. The peak B has a shift between about –1000 arc seconds and about –1500 arc seconds (e.g., compressed stress), and an intensity of about 1000 a.u. The peak C has a peak shift of about 1700 arc seconds to about 2400 arc seconds (e.g., tensile stress), and an intensity of about 800 a.u. The stress corresponding to peak C is similar to that of an epitaxial film having a carbon concentration of about 1.8 atomic percent. As discussed above, epitaxial films containing greater than about 1 atomic percent carbon have unacceptable film quality. Thus, while the tensile strength of highly phosphorus-doped epitaxial films is about equal to an epitaxial film containing 1.8 atomic percent carbon, the highly phosphorus-doped epitaxial films exhibit a higher film quality than the carbon-doped epitaxial films of comparable tensile strain.

Benefits of the invention include high quality silicon epitaxial films exhibiting high tensile strain. Increased process pressures combined with reduced process temperatures allow for formation of a silicon epitaxial film having a phosphorus concentration of $3 \times 10^{21}$ atoms per cubic centimeter or greater, without experiencing surface poisoning. The high phosphorus concentration induces stress within the deposited epitaxial film, thereby increasing tensile strain, leading to increased carrier mobility and improved device performance. The tensile strain obtained by highly phosphorus-doped epitaxial silicon is comparable to epitaxial films containing up to 1.8 atomic percent carbon. However, highly phosphorus-doped epitaxial silicon of the present invention avoids the quality issues associated with carbon-doped films.

While the foregoing is directed to embodiments of the present invention, other and further embodiments of the invention may be devised without departing from the basic scope thereof, and the scope thereof is determined by the claims that follow.

We claim:

1. A method of forming a film on a substrate, comprising:
   positioning a substrate within a processing chamber;
   heating the substrate to a temperature within a range from about 550 degrees Celsius to about 750 degrees Celsius;
   introducing process gases into the processing chamber, the process gases consisting of a silicon source, a phosphorus source, and a carrier gas; and
   depositing a substantially carbon-free silicon epitaxial layer on the substrate, the substantially carbon-free silicon epitaxial layer having a phosphorus concentration of $3 \times 10^{21}$ atoms per cubic centimeter or greater and a tensile stress from about 1 gigapascal to about 1.5 gigapascals, wherein the substantially carbon-free silicon epitaxial layer is deposited at a chamber pressure of about 300 Torr or greater, and wherein the substantially carbon-free silicon epitaxial layer is an alloy between silicon and silicon phosphide.

2. The method of claim 1, wherein the silicon source is dichlorosilane.

3. The method of claim 2, wherein the phosphorus source is phosphine.

4. A method of forming a film on a substrate, comprising:
   positioning a substrate within a processing chamber;
   heating the substrate to a temperature within a range from about 600 degrees Celsius to about 650 degrees Celsius;
   introducing process gases into the processing chamber, the process gases consisting of a silicon source, a phosphorus source, and a carrier gas, wherein the silicon source is introduced at a gas flow rate between about 300 sccm and about 400 sccm, the phosphorus source is introduced at a gas flow rate between about 2 sccm and about 30 sccm, and the carrier gas is introduced at a gas flow rate of about 3 to about 30 standard liters per minute; and depositing a substantially carbon-free silicon epitaxial layer on the substrate, the substantially carbon-free silicon epitaxial layer having a phosphorus concentration of $3 \times 10^{21}$ atoms per cubic centimeter or greater and a tensile stress from about 1 gigapascal to about 1.5 gigapascals, wherein the substantially carbon-free silicon epitaxial layer is deposited at a chamber pressure of 300 Torr or greater, and wherein the substantially carbon-free silicon epitaxial layer is an alloy between silicon and silicon phosphide.

5. The method of claim 4, wherein the silicon source is silane or disilane.

6. The method of claim 4, wherein the silicon source is dichlorosilane.

\* \* \* \* \*